United States Patent
Hu et al.

(10) Patent No.: US 12,232,394 B2
(45) Date of Patent: Feb. 18, 2025

(54) MODULE STRUCTURE, TOUCH MODULE, DISPLAY MODULE AND DISPLAY APPARATUS HAVING FLOATING TERMINAL TO PREVENT CRACK

(71) Applicants: Chengdu BOE Optoelectronics Technology Co., Ltd., Sichuan (CN); BOE TECHNOLOGY GROUP CO., LTD., Beijing (CN)

(72) Inventors: Hongjin Hu, Beijing (CN); Wei Gong, Beijing (CN); Chang Wang, Beijing (CN); Mingqiang Wang, Beijing (CN); Jiaxiang Zhang, Beijing (CN); Yonglin Chen, Beijing (CN); Fei Li, Beijing (CN); Xin Bi, Beijing (CN); Bin Zhang, Beijing (CN); Kun Zuo, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 36 days.

(21) Appl. No.: 17/924,669

(22) PCT Filed: Jul. 30, 2021

(86) PCT No.: PCT/CN2021/109688
§ 371 (c)(1),
(2) Date: Nov. 10, 2022

(87) PCT Pub. No.: WO2022/078016
PCT Pub. Date: Apr. 21, 2022

(65) Prior Publication Data
US 2023/0200179 A1    Jun. 22, 2023

(30) Foreign Application Priority Data

Oct. 13, 2020   (CN) .......................... 202011090688.9

(51) Int. Cl.
H10K 59/40    (2023.01)
G06F 3/044    (2006.01)

(52) U.S. Cl.
CPC ............. *H10K 59/40* (2023.02); *G06F 3/044* (2013.01)

(58) Field of Classification Search
CPC ............................... H10K 59/40; G06F 3/044
See application file for complete search history.

(56) References Cited

U.S. PATENT DOCUMENTS 9,356,087 B1 *   5/2016   Lee ...................... H01L 27/124
2009/0160802 A1   6/2009   Yasumi
(Continued)

FOREIGN PATENT DOCUMENTS

CN    105892177 A    8/2016
CN    105988616 A    10/2016
(Continued)

*Primary Examiner* — Afroza Chowdhury
(74) *Attorney, Agent, or Firm* — HOUTTEMAN LAW LLC

(57) ABSTRACT

A module structure, a touch module, a display module and a display apparatus are provided. The module structure includes: a substrate including a base substrate, wherein the base substrate includes a functional area and a bonding area on one side of the functional area; a plurality of bonding terminals are provided in the bonding area and arranged along a first direction and each bonding terminal extends along a second direction, and at least one floating terminal is provided in the bonding area and on at least one side of the plurality of bonding terminals in the first direction; the module structure further includes a flexible circuit board, including: a plurality of first connection terminals provided corresponding to the plurality of bonding terminals, and at least one second connection terminal provided corresponding to the at least one floating terminal.

19 Claims, 17 Drawing Sheets

(56) References Cited

U.S. PATENT DOCUMENTS

| | | | | |
|---|---|---|---|---|
| 2016/0155788 A1* | 6/2016 | Kwon | ................... | H10K 59/131 |
| | | | | 257/40 |
| 2016/0172623 A1* | 6/2016 | Lee | ....................... | H10K 50/84 |
| | | | | 257/40 |
| 2016/0174304 A1* | 6/2016 | Kim | ..................... | H10K 77/111 |
| 2017/0045672 A1 | 2/2017 | Lee et al. | | |
| 2018/0233552 A1* | 8/2018 | Lee | ....................... | H10K 71/00 |
| 2019/0116672 A1* | 4/2019 | Zhao | ................... | G02F 1/13452 |

FOREIGN PATENT DOCUMENTS

| | | |
|---|---|---|
| CN | 206931070 U | 1/2018 |
| CN | 108470762 A | 8/2018 |
| CN | 109739386 A | 5/2019 |
| CN | 110413050 A | 11/2019 |
| CN | 111007963 A | 4/2020 |
| CN | 210721421 U | 6/2020 |
| CN | 112230795 A | 1/2021 |

\* cited by examiner

MODULE STRUCTURE, TOUCH MODULE, DISPLAY MODULE AND DISPLAY APPARATUS HAVING FLOATING TERMINAL TO PREVENT CRACK

CROSS REFERENCE TO RELATED APPLICATIONS

The present disclosure claims the priority of the Chinese Patent Application No. 202011090688.9 filed to the CNIPA on Oct. 13, 2020, entitled "touch module and display apparatus", the content of which is incorporated herein by reference in its entirety.

TECHNICAL FIELD

The present disclosure relates to the field of touch display technology, and in particular to a module structure, a touch module, a display module and a display apparatus.

BACKGROUND

An organic light emitting diode (OLED) display apparatus is a display screen based on organic light emitting diodes, and has the excellent characteristics of self-luminescence, a high contrast, a less thickness, a wide viewing angle, a high response speed, an application in a flexible panel, a wide temperature range for using, a simple structure and a simple manufacturing procedure and the like, and thus, has attracted more and more attention and has a wide application prospect. In the current production process of modules in various manufacturers, a touch function is generally integrated by externally hanging a touch module on an OLED display module, so that the display function and the touch function of the display apparatus are integrated.

SUMMARY

In one aspect, an embodiment of the present disclosure provides a module structure, including: a substrate including a base substrate, wherein the base substrate includes a functional area and a bonding area on one side of the functional area; a plurality of bonding terminals are provided in the bonding area and arranged along a first direction and each bonding terminal extends along a second direction, and at least one floating terminal is provided in the bonding area and on at least one side of the plurality of bonding terminals in the first direction; and a flexible circuit board, including: a plurality of first connection terminals corresponding to the plurality of bonding terminals, and at least one second connection terminal corresponding to the at least one floating terminal.

Optionally, in the above module structure according to the embodiment of the present disclosure, floating terminals are provided on both sides of the plurality of bonding terminals in the first direction; and each side of the plurality of bonding terminals in the first direction is provided with at least one floating terminal thereon.

Optionally, in the above module structure according to the embodiment of the present disclosure, the number of floating terminals on one side of the plurality of bonding terminals in the first direction is the same as that of floating terminals on the other side of the plurality of bonding terminals in the first direction.

Optionally, in the above module structure according to the embodiment of the present disclosure, each floating terminal includes a second portion extending in the second direction; each second connection terminal includes a sixth portion extending in the second direction; and wherein an orthographic projection of the sixth portion of a second connection terminal on the base substrate overlaps with an orthographic projection of the second portion of a corresponding floating terminal on the base substrate.

Optionally, in the above module structure according to the embodiment of the present disclosure, at least a part of the second portion and at least a part of the sixth portion are in the bonding area; the module structure further includes a polarizer on a side where a functional surface of the substrate is located, wherein the polarizer includes an opening, and an orthographic projection of the opening on the base substrate overlaps an orthographic projection of the bonding area on the base substrate; the second portion has a first side away from the bonding terminals; and an orthographic projection of an extension line of the first side pointing to the functional area on the base substrate and an orthographic projection of a first edge, which extends along the first direction and is adjacent to the functional area, of the opening on the base substrate intersect each other at a first intersection point; the opening has a second edge intersecting the first direction at an endpoint away from the functional area, and an orthographic projection of an extension line of the second edge pointing to the functional area on the base substrate or an orthographic projection of a tangent line of the second edge at the endpoint on the base substrate and an orthographic projection of an extension line of the first edge on the base substrate intersect each other at a second intersection point; and the first intersection point, the second intersection point and the endpoint of the opening are sequentially connected to form a triangle, and an angle of the triangle at the second intersection point is an obtuse angle.

Optionally, in the above module structure according to the embodiment of the present disclosure, the angle is in a range from 105° to 115°.

Optionally, in the above module structure according to the embodiment of the present disclosure, a distance from the second intersection point to the first intersection point is substantially equal to the distance from the second intersection point to the endpoint.

Optionally, in the above module structure according to the embodiment of the present disclosure, each floating terminal further includes: a fourth portion and a fifth portion arranged in the second direction and in the bonding area and in contact with the second portion; each second connection terminal further includes: a seventh portion extending in the first direction and on a side of the sixth portion away from an area where the plurality of first connection terminals are located; and wherein in the at least one floating terminal and the at least one second connection terminal corresponding to each other, an orthographic projection of the seventh portion on the base substrate overlaps an orthographic projection of a gap between the fourth portion and the fifth portion on the base substrate.

Optionally, in the above module structure according to the embodiment of the present disclosure, the fourth portion and the fifth portion extend through the second portion.

Optionally, in the above module structure according to the embodiment of the present disclosure, the substrate further includes at least one signal line integrally with the at least one floating terminal and around the functional area.

Optionally, in the above module structure according to the embodiment of the present disclosure, the base substrate further includes a transition area between the bonding area and the functional area; and the at least one floating terminal extends in the second direction at least to cover an interface line between the bonding area and the transition area.

Optionally, in the above module structure according to the embodiment of the present disclosure, each floating terminal further includes a first portion alongside the second portion, and a third portion connecting the first portion and the second portion; wherein the first portion and the second portion extend from the bonding area to the transition area; the second portion is closer to an area where the plurality of bonding terminals are located than the first portion; and the third portion is in the transition area; each floating terminal is arranged corresponding to the two second connection terminals; and wherein the sixth portions of the two corresponding second connection terminals are arranged corresponding to the first portion and the second portion of each floating terminal, respectively.

Optionally, in the above module structure according to the embodiment of the present disclosure, the module structure further includes a polarizer on a side where a functional surface of the substrate is located, where the polarizer includes an opening, and an orthographic projection of the opening on the base substrate overlaps an orthographic projection of the transition area and the bonding area on the base substrate; the second portion has a first side away from the bonding terminals; and an orthographic projection of an extension line of the first side pointing to the functional area on the base substrate and an orthographic projection of a first edge, which extends along the first direction and is adjacent to the functional area, of the opening on the base substrate intersect each other at a first intersection point; the opening has a second edge intersecting the first direction and the second direction at an endpoint away from the functional area, and an orthographic projection of an extension line of the second edge pointing to the functional area on the base substrate or an orthographic projection of a tangent line of the second edge at the endpoint on the base substrate and an orthographic projection of an extension line of the first edge on the base substrate intersect each other at a second intersection point; and the first intersection point, the second intersection point and the endpoint of the opening are sequentially connected to form a triangle, and an angle of the triangle at the second intersection point is a right angle or an obtuse angle.

Optionally, in the above module structure according to the embodiment of the present disclosure, a ratio of a sum of widths of all of floating terminals on one side of the plurality of bonding terminals to a sum of widths of the plurality of bonding terminals in the first direction is in a range from 10% to 20%.

Optionally, in the above module structure according to the embodiment of the present disclosure, a width of each floating terminal in the first direction is equal to a sum of widths of at least three bonding terminals.

Optionally, in the above module structure according to the embodiment of the present disclosure, the plurality of bonding terminals are in a same layer as the at least one floating terminal.

Optionally, in the above module structure according to the embodiment of the present disclosure, the plurality of first connection terminals are in a same layer as the plurality of second connection terminals.

Optionally, in the above module structure according to the embodiment of the present disclosure, the substrate further includes: a plurality of signal lines electrically connected to the plurality of bonding terminals, respectively.

Optionally, in the above module structure according to the embodiment of the present disclosure, the plurality of signal lines and the corresponding bonding terminals have a one-piece structure.

In another aspect, an embodiment of the present disclosure provides a touch module, including the above module structure according to the embodiment of the present disclosure.

In another aspect, an embodiment of the present disclosure provides a display module, including the above module structure according to the embodiment of the present disclosure.

In another aspect, an embodiment of the present disclosure provides a display apparatus, including: the display module according to the embodiment of the present disclosure, and the touch module according to the embodiment of the present disclosure, wherein the substrate in the touch module is on a side of a display surface of the display module; and the flexible circuit board in the touch module is bent from a touch surface of the substrate in the touch module toward a direction away from the display surface of the display module.

Optionally, in the display apparatus according to the embodiment of the present disclosure, the display apparatus further includes: a main flexible circuit board between the display module and the flexible circuit board in the touch module, and an adapter connecting the main flexible circuit board and the flexible circuit board in the touch module; and the flexible circuit board in the touch module further includes: a plurality of detection signal lines configured to electrically connect the plurality of second connection terminals of the touch module to the adapter, respectively, and configured to detect cracks when a loop is formed between the plurality of second connection terminals and the at least one floating terminal of the touch module.

DETAIL DESCRIPTION OF EMBODIMENTS

Figure 1:
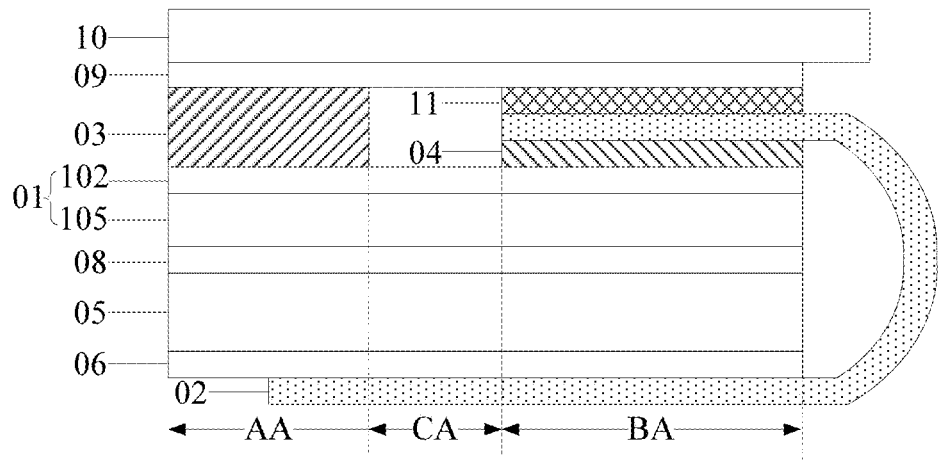
FIG. 1 is a schematic diagram of a structure of a display apparatus in the related art.

In order to make the objects, technical solutions and advantages of the embodiments of the present disclosure more apparent, the technical solutions of the embodiments of the present disclosure will be clearly and completely described below with reference to the drawings of the embodiments of the present disclosure. It should be noted that the sizes and shapes of various elements in the drawings are not to scale, but are merely intended to schematically illustrate the present disclosure. Like or similar reference characters refer to like or similar elements or elements having like or similar functions throughout.

Unless defined otherwise, technical or scientific terms used herein shall have the ordinary meaning as understood by one of ordinary skill in the art to which the present disclosure belongs. The terms "first", "second", and the like used in the description and the claims of the present disclosure are not intended to indicate any order, quantity, or importance, but rather are used for distinguishing one element from another. The term of "comprising", "including", or the like, means that the element or item preceding the term contains the element or item listed after the term and its equivalent, but does not exclude other elements or items. The terms "inside", "outside", "upper", "lower" and the like are used only for indicating relative positional relationships, and when the absolute position of an object being described is changed, the relative positional relationships may also be changed accordingly.

Figure 2:
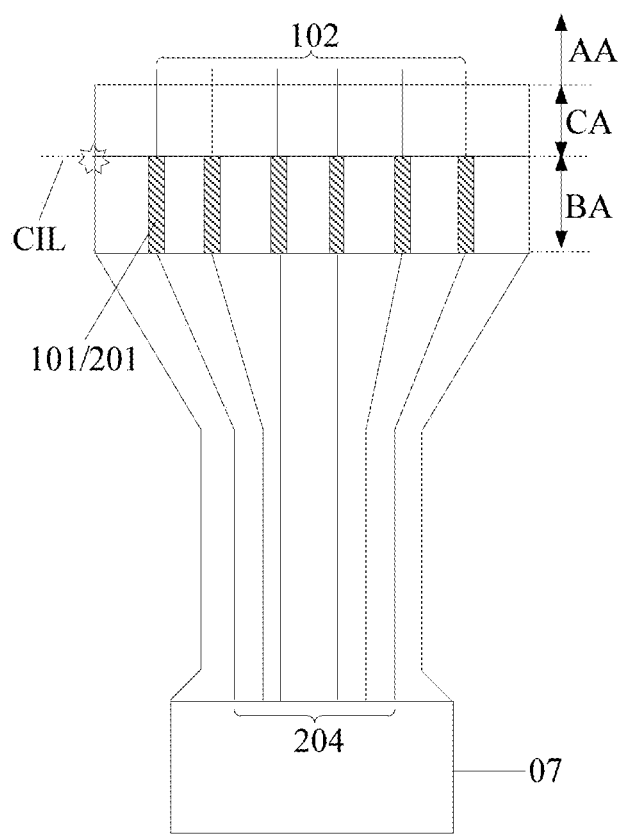
FIG. 2 is a schematic diagram of another structure of a display apparatus in the related art.

As people are pursuing a display product with a narrow bezel, it is required to have a narrower bonding area between a substrate 01 (e.g., a touch substrate, a touch sensor) and a flexible circuit board 02 (e.g., a touch flexible print circuit (TFPC)) in a design for a module structure (e.g., a touch module PST). In the actual production procedure of the module structure, the flexible circuit board 02 needs to be plugged with a main flexible circuit board (Main Flexible Print Circuits (MFPC)) through a bending process, as shown in FIGS. 1 and 2. However, the narrower bonding area (BA) cannot provide a stronger adhesive force and the flexible circuit board 02 is subjected to a great bending stress when the flexible circuit board 02 is plugged with the main flexible circuit board through a bending process, so that a signal line 102 (e.g., a touch signal trace line) connected to a bonding terminal 101 (e.g., a touch bonding terminal) may be cracked at an interface line (Crack Issue Line (CIL)) between a transition area (contact area (CA)) and the bonding area BA, which may cause the module structure to fail to operate normally (e.g., may induce a serious touch non-sensing defect).

Further, the inventor found by observing a number of practical cases that these cracks generally start at both side edges of the bonding area BA. The inventor further found by a deep analysis that when alignment and adjustment are performed for plugging the flexible circuit board 02 with the main flexible circuit board, operators in production lines pull the flexible circuit board 02 in a left-right direction, so that most of stress is concentrated on the two side edges of the bonding area BA, thereby causing the crack defect.

In view of the above problems in the related art, an embodiment of the present disclosure provides a module structure, as shown in FIGS. 3 to 9, including: a substrate 01 including a base substrate 100, wherein the base substrate 100 includes a functional area AA, a bonding area BA positioned on one side of the functional area AA, and a transition area CA connecting the functional area AA and the bonding area BA; a plurality of bonding terminals (Trace Pad) 101 are provided in the bonding area BA and arranged along a first direction X, and each bonding terminal extends along a second direction Y, and at least one floating terminal (Dummy Pad) 103 is provided in the bonding area BA and on at least one side of the plurality of bonding terminals 101 in the first direction X; in some embodiments, a bonding terminal of the ground line (GND) may also be considered to be a floating terminal; a flexible circuit board 02, including: a plurality of first connection terminals 201 provided corresponding to the plurality of bonding terminals 101, and at least one second connection terminal 202 provided corresponding to the at least one floating terminal 103. In the present disclosure, the terminals of different types are arranged corresponding to each other, which means that the terminals are correspondingly bound, or orthographic projections of the correspondingly bound terminals on the base substrate 100 overlap each other.

In the module structure provided by the embodiment of the present disclosure, the at least one floating terminal 103 is provided on the at least one side of the plurality of bonding terminals 101 in the bonding area BA, and the at least one second connection terminal 202 is provided corresponding to the at least one floating terminal 103, so that the effective bonding area between the substrate 01 and the flexible circuit board 02 is increased, and thus, the at least one floating terminal 103 can be used to prevent a crack from expanding to an area where the bonding terminals 101 are located, thereby significantly enhancing the anti-pulling stress effect of the signal lines 102 connected to the bonding terminals 101 at the interface line CIL, and playing a positive role in preventing product cracks. In a specific implementation, the area of the bonding area BA may be changed from the original 3.4159 mm$^2$ to 3.9840 mm$^2$, i.e., the effective bonding area is increased by 16.7%.

Figure 3:
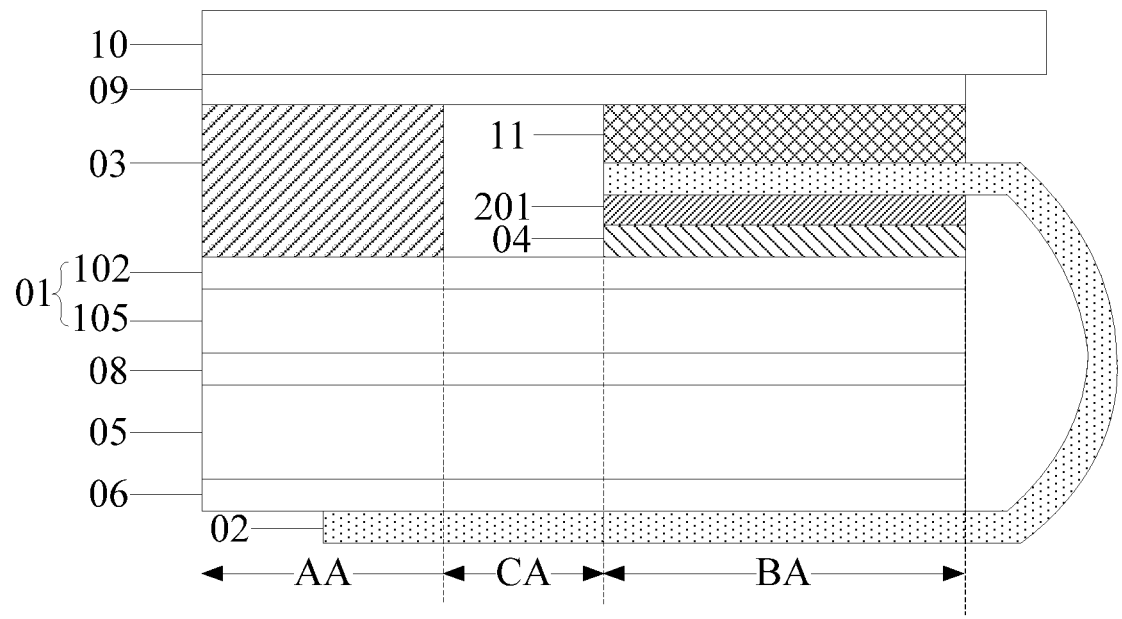
FIG. 3 is a schematic diagram of a structure of a display apparatus according to an embodiment of the present disclosure.
Figure 4:
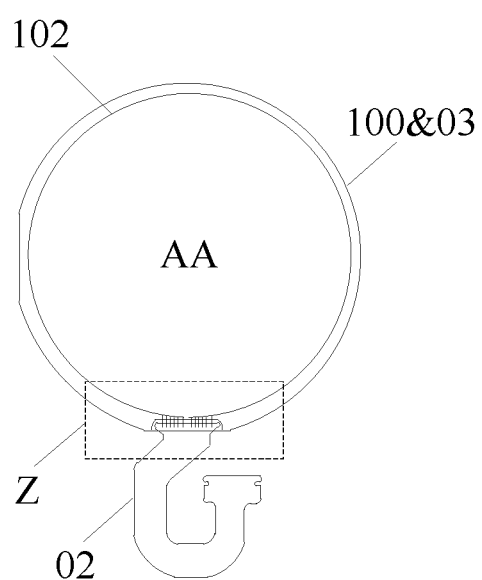
FIG. 4 is a schematic diagram of another structure of a display apparatus according to an embodiment of the present disclosure.
Figure 5:
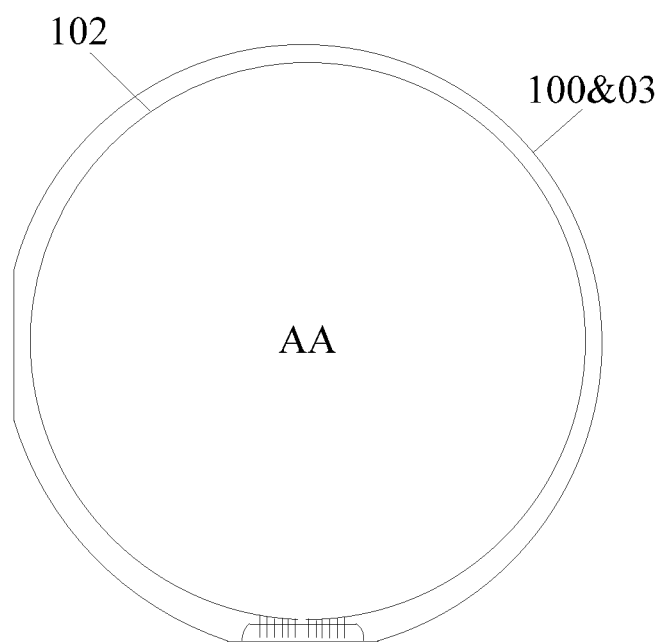
FIG. 5 is an enlarged view of a structure of a polarizer and a substrate of FIG. 4.
Figure 6:
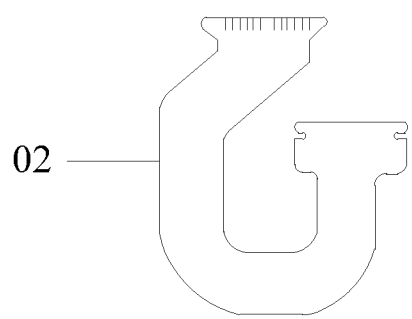
FIG. 6 is an enlarged view of a structure of a flexible circuit board shown in FIG. 4.
Figure 7:
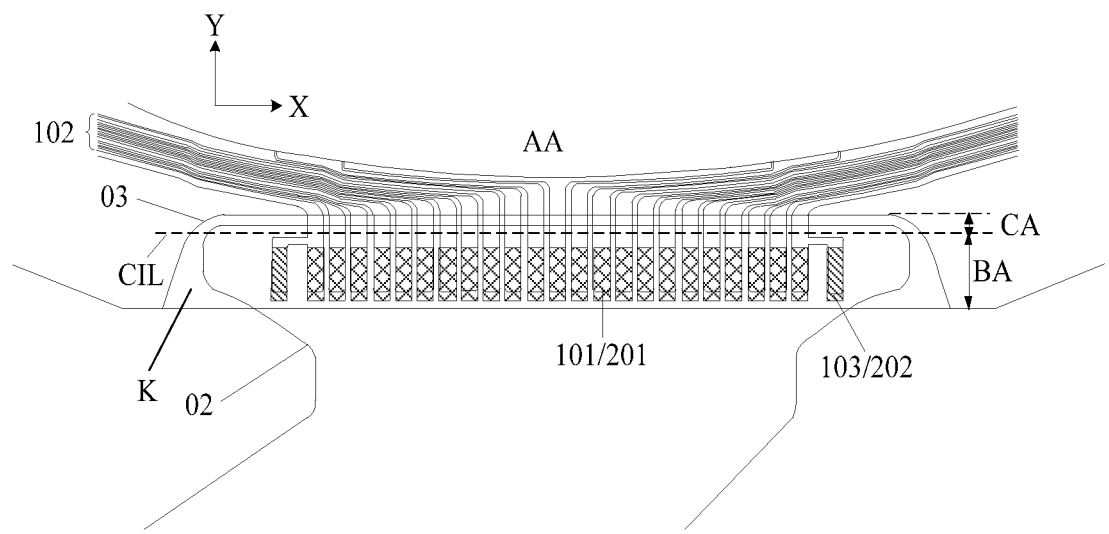
FIG. 7 is an enlarged view of a structure in a region Z in FIG. 4.

In some embodiments, as shown in FIG. 3, the flexible circuit board 02 may be bent to the back side of the substrate 01 (i.e. a same side of the base substrate 100 away from the bonding terminals 101), to reduce a width of a frame where the flexible circuit board 02 is located in the module structure.

Figure 8:
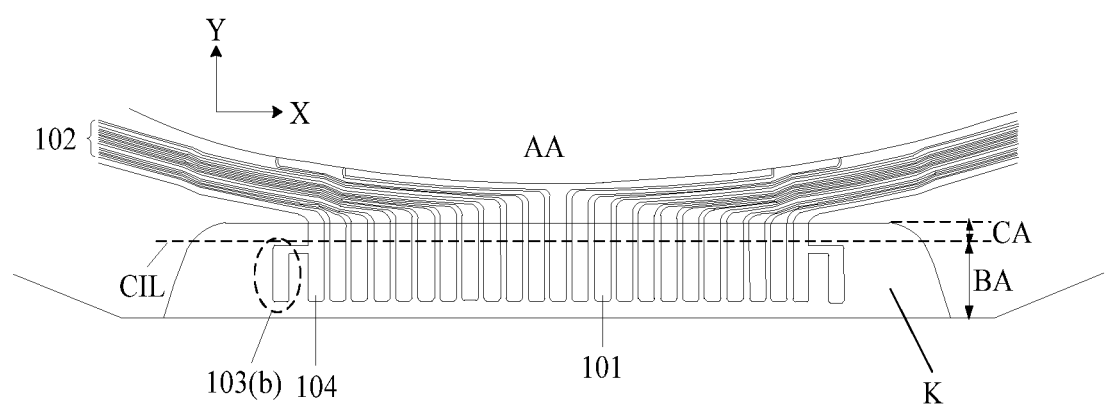
FIG. 8 is a schematic diagram of a structure of a substrate included in a display apparatus shown in FIG. 7.
Figure 9:
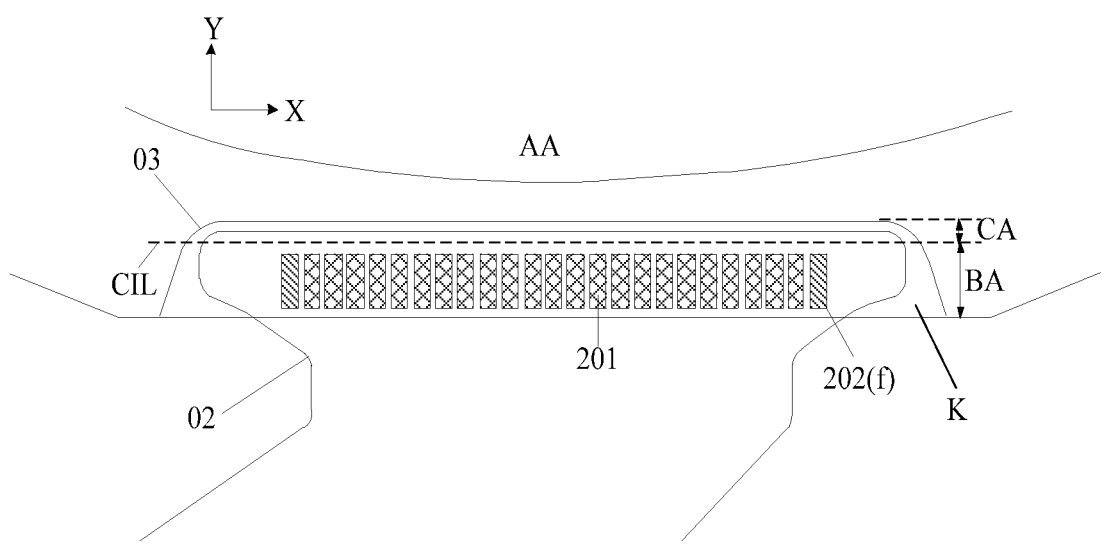
FIG. 9 is a schematic diagram of a structure of a flexible circuit board included in a display apparatus shown in FIG. 7.
Figure 10:
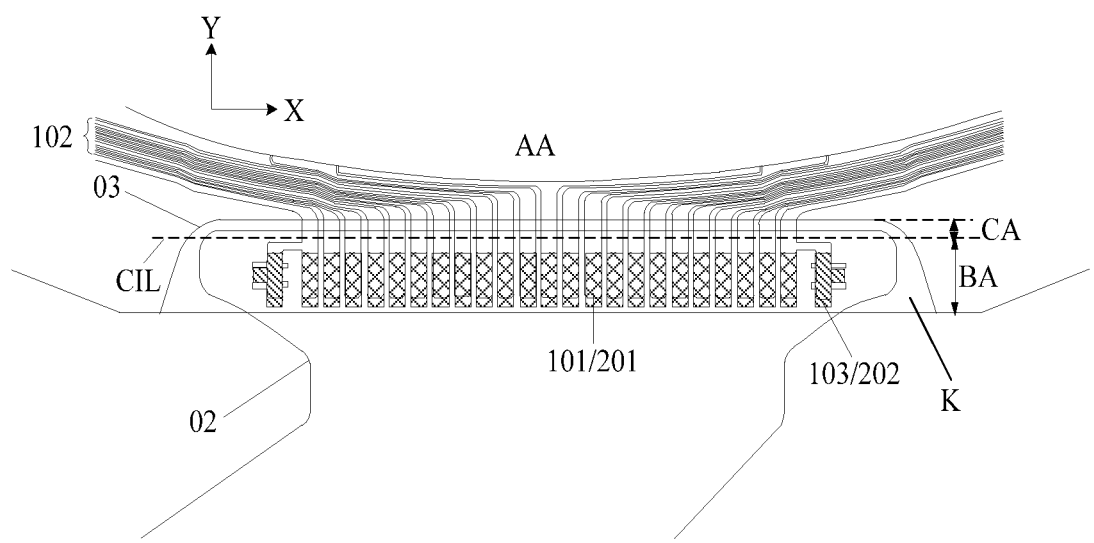
FIG. 10 is an enlarged view of another structure in a region Z in FIG. 4.
Figure 11:
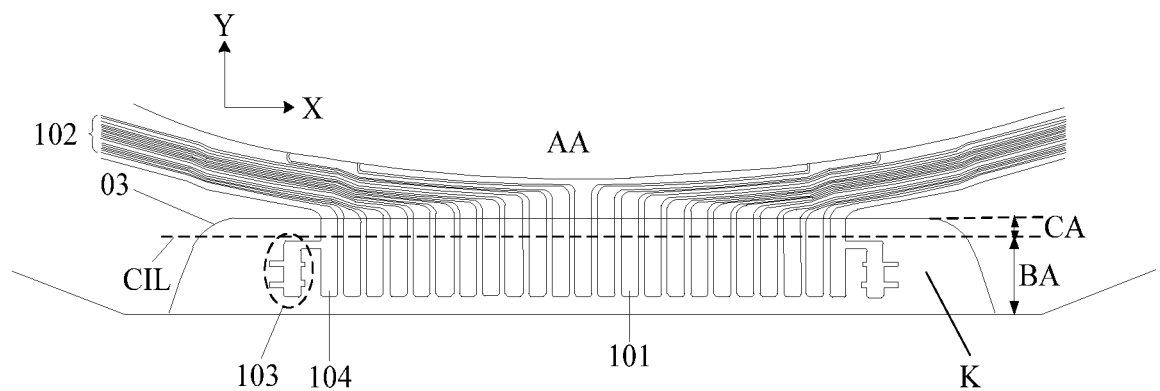
FIG. 11 is a schematic diagram of a structure of a substrate included in a display apparatus shown in FIG. 10.
Figure 12:
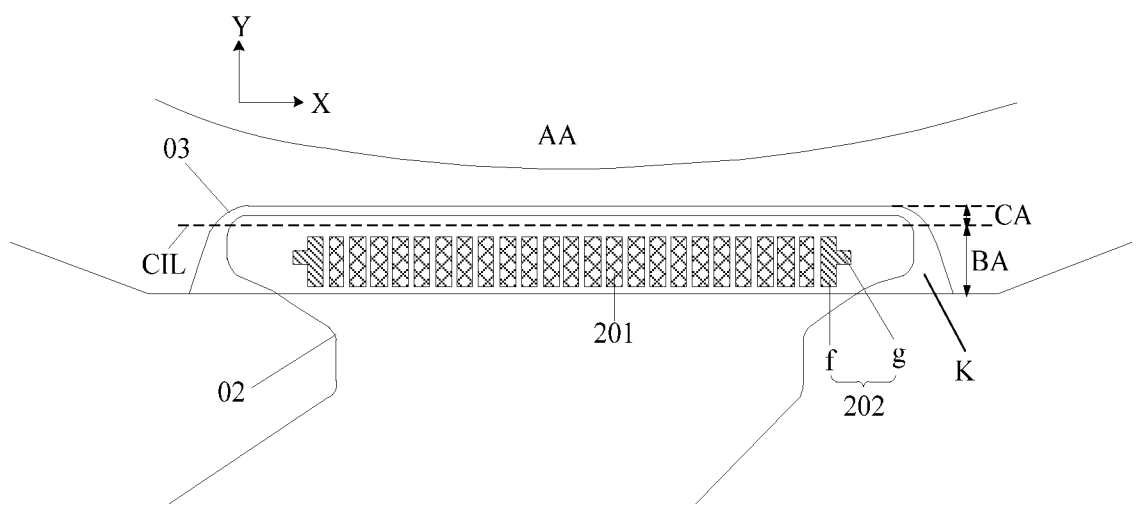
FIG. 12 is a schematic diagram of a structure of a flexible circuit board included in a display apparatus shown in FIG. 10.

Optionally, in the above module structure provided in the embodiment of the present disclosure, as shown in FIGS. 8 and 11, floating terminals 103 are provided on both sides of the bonding terminals 101 in the first direction X, and at least one floating terminal 103 is provided on each side. The floating terminals 103 arranged on the two sides of the bonding terminals 101 can respectively inhibit cracks from being generated in edge areas on the two sides of the bonding terminals 101, so that the cracks are prevented from expanding to the area where the bonding terminals 101 are located, and the normal function of the module structure can be ensured.

Optionally, in the above module structure provided in the embodiment of the present disclosure, as shown in FIGS. 8 and 11, the number of the floating terminals 103 on one side of the plurality of bonding terminals 101 is the same as that of the floating terminals 103 on the other side. Because the cracks are easily generated in the edge areas on two sides of the bonding terminals 101, the floating terminals 103 are uniformly arranged on two sides of the bonding terminals 101, so that the function abnormality of the module structure caused by the cracks can be effectively inhibited.

Optionally, in the above module structure provided by the embodiment of the present disclosure, as shown in FIGS. 7 to 13, each floating terminal 103 includes a second portion b extending in the second direction Y, and the second connection terminal 202 includes a sixth portion f extending in the second direction Y, wherein an orthographic projection of the sixth portion f of the second connection terminal 202 on the base substrate 100 and an orthographic projection of the second portion b of the corresponding floating terminal 103 on the base substrate 100 overlap each other. In some embodiments, the orthographic projection of the sixth portion f of the second connection terminal 202 on the base substrate 100 may substantially coincide with the orthographic projection of the second portion b of the corresponding floating terminal 103 on the base substrate 100.

The second portion b of the floating terminal 103 extends only in the second direction Y, so that the structure is simpler and the manufacturing procedure is easy. In addition, in some embodiments, an alignment may be performed with reference to the second portion b of the floating terminal 103 in the bonding process.

It should be noted that in the embodiments provided in the present disclosure, due to the limitation of the process conditions or the influence of other factors such as measurement, the above term "substantially" means being possibly identical, or an error possibly existing, so that the relationship of "substantially" between the above features is within the protection scope of the present disclosure as long as the allowance of the error (for example, within a fluctuation of ±5%) is satisfied.

Optionally, in the above module structure provided in the embodiment of the present disclosure, as shown in FIGS. 7 to 13, at least a part of the second portion b and at least a part of the sixth portion f may be located in the bonding area BA; the module structure may further include a polarizer 03 located on a side where a functional surface of the substrate 01 (for example, a functional layer is provided on a side of the signal lines 102 away from the base substrate 100, and a surface of the functional layer away from the base substrate 100 is the functional surface) is located, where the polarizer 03 includes an opening K, and an orthographic projection of the opening K on the base substrate 100 overlaps an orthographic projection of the bonding area BA on the base substrate 100; the second portion b has a first side away from the bonding terminals 101; and an orthographic projection of an extension line of the first side pointing towards the functional area AA on the base substrate 100 and an orthographic projection of a first edge, which extends along the first direction X and is adjacent to the functional area AA, of the opening K on the base substrate 100 intersect each other at a first intersection point C; the opening K has a second edge intersecting the first direction X at an endpoint A away from the functional area AA, and an orthographic projection of an extension line of the second edge (as a straight line) pointing towards the functional area AA on the base substrate 100 or an orthographic projection of a tangent line of the second edge (as an arc line) at the endpoint A on the base substrate 100 intersects with an orthographic projection of an extension line of the first edge on the base substrate 100 at a second intersection point B; the first intersection point C, the second intersection point B and the endpoint A of the opening K are sequentially connected to form a triangle ABC, and an angle (namely, angle B) of the triangle ABC at the second intersection point B is an obtuse angle.

Figure 14:
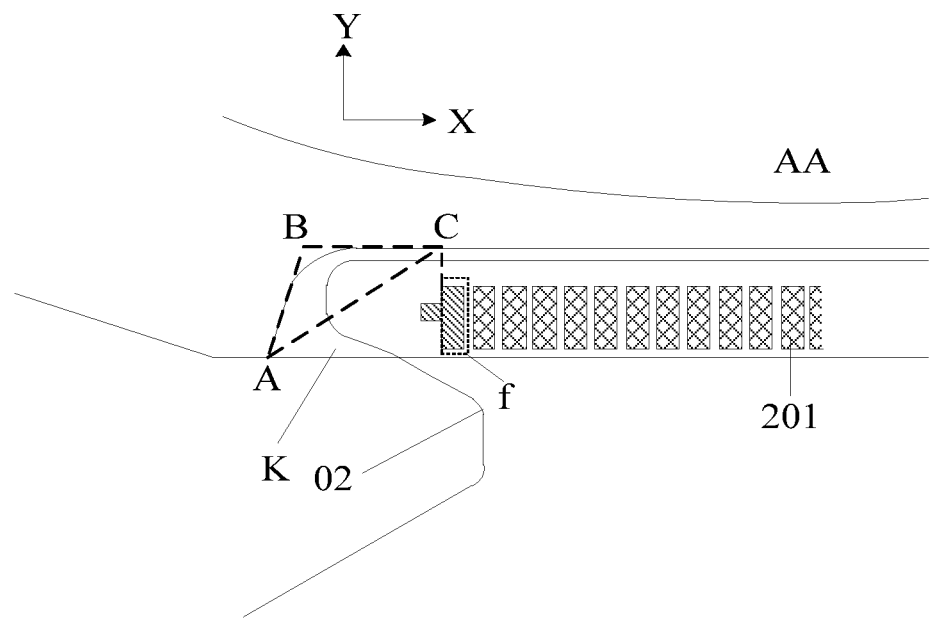
FIG. 14 is an enlarged schematic diagram of a part of FIG. 12.

It will be appreciated that the orthographic projections of the correspondingly disposed second and sixth portions b and f on the base substrate 100 substantially coincide with each other, so that the triangle ABC may alternatively be formed by the sixth portion f and the opening K in some embodiments. As shown in FIG. 14, the sixth portion f has a third side away from the first connection terminals 201; and an orthographic projection of an extension line of the third side pointing to the functional area AA on the base substrate 100 and an orthographic projection of a first edge, which extends along the first direction X and is adjacent to the functional area AA, of the opening K on the base substrate 100 intersect each other at a first intersection point C; the opening K has a second edge intersecting the first direction X at an endpoint A away from the functional area AA, and an orthographic projection of an extension line of the second edge (as a straight line) pointing towards the functional area AA on the base substrate 100 or an orthographic projection of a tangent line of the second edge (as an arc line) at the endpoint A on the base substrate 100 intersect with an orthographic projection of an extension line of the first edge on the base substrate 100 at a second intersection point B; the first intersection point C, the second intersection point B and the endpoint A of the opening K are sequentially connected to form a triangle ABC, and an angle (namely, angle B) of the triangle ABC at the second intersection point B is an obtuse angle.

Figure 15:
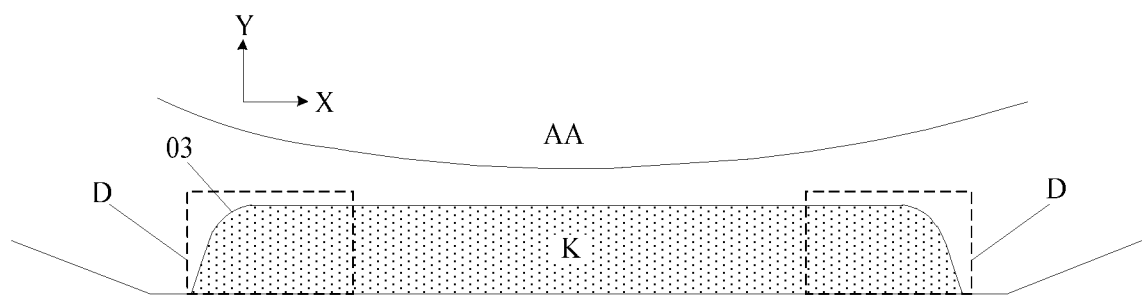
FIG. 15 is a schematic view of an opening of a polarizer of FIG. 4.

FIG. 15 shows a stress distribution area of the bent flexible circuit board 02 where the opening K of the polarizer 03 is located. By constructing the triangle ABC with the second portion b or the sixth portion f as a reference, a corner D on one side (i.e., the left side or the right side) of the opening K of the polarizer 03 can be designed to have a shape similar to a letter "V", so that the stress can be well dispersed, excessive stress concentration can be avoided, and the risk of cracks can be reduced.

Figure 16:
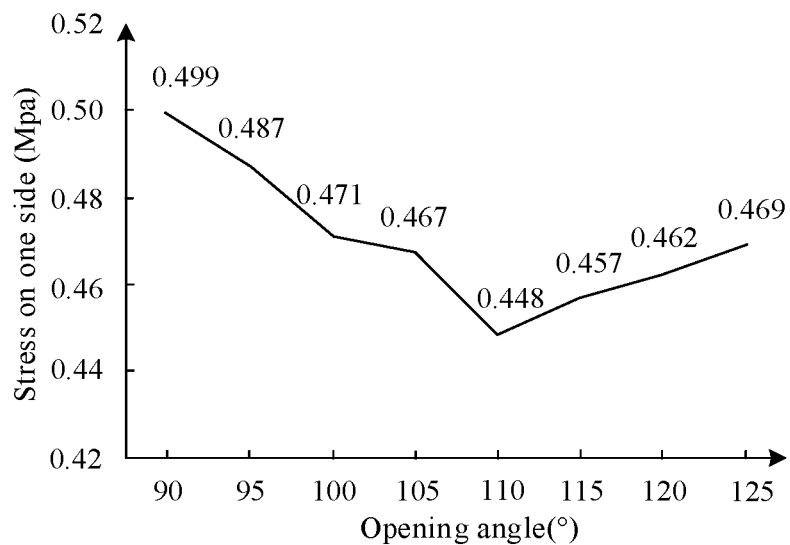
FIG. 16 is a curve graph showing a relationship between an opening angle of a polarizer shown in FIG. 15 and a stress magnitude.

Specifically, as shown in the following table, the present disclosure simulates the angle (i.e., the angle B) of the opening of the polarizer 03 in FIGS. 13 and 14, where the simulated angle (i.e., the angle B) of the opening is in a range from 95° to 125°, with a step size of 5°. As can be seen from the following table and FIG. 16, compared with the "U"-shaped opening with the angle B of 90°, the "V"-shaped opening K with the obtuse angle B has a better stress dissipation effect, and prevents the signal lines 102 from cracking. When the angle B is in a range from 105° to 115° (e.g. 110°), the flexible circuit board 02 exhibits the least stress and the best performance in the bonding area BA.

| Table for correspondence between angle of opening and stress magnitude | | | | | | | | |
|---|---|---|---|---|---|---|---|---|
| | Angle of opening (°) | | | | | | | |
| | 90 | 95 | 100 | 105 | 110 | 115 | 120 | 125 |
| Stress on one side (Mpa) | 0.499 | 0.487 | 0.471 | 0.467 | 0.448 | 0.457 | 0.462 | 0.469 |

Figure 13:
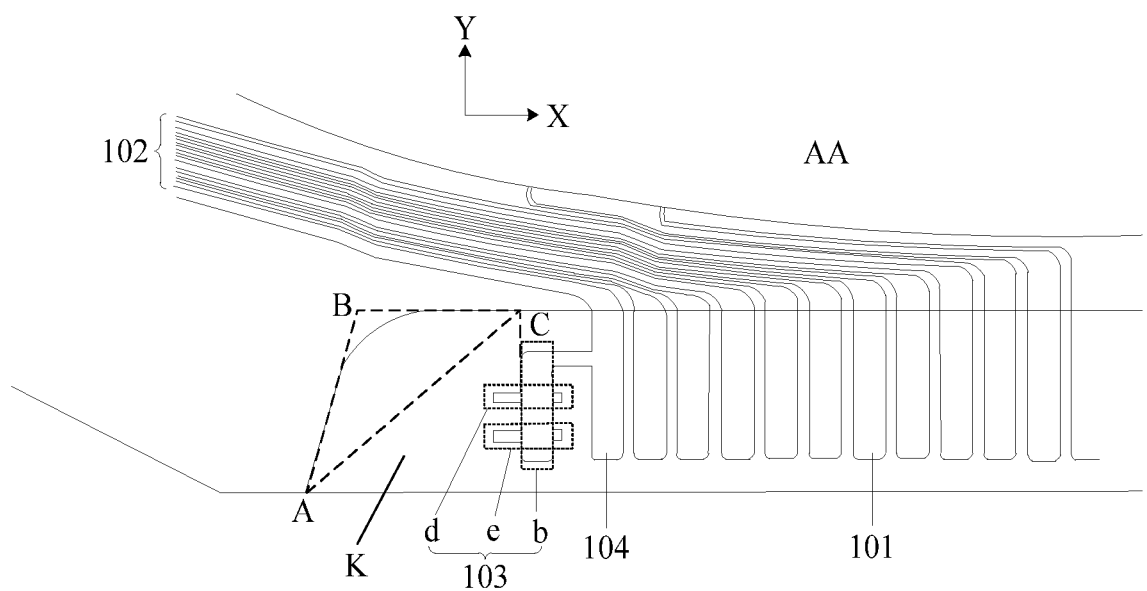
FIG. 13 is an enlarged schematic diagram of a part of FIG. 11.

Optionally, in the above module structure provided in the embodiment of the present disclosure, in order to better achieve dissipation of the stress in the area where the opening K is located, as shown in FIG. 13 and FIG. 14, a distance from the second intersection point B to the first intersection point C (i.e., the line segment BC) may be set to be substantially equal to that from the second intersection point B to the endpoint A (i.e., the line segment AB), that is, both of them may be completely equal to each other, or may have some deviation (e.g., ±5%) therebetween.

Optionally, in the above module structure provided in the embodiment of the present disclosure, as shown in FIGS. 10 to 14, each floating terminal 103 may further include: a fourth portion d and a fifth portion e arranged in the second direction Y; wherein the fourth and fifth portions d, e are located in the bonding area BA and are in contact with the second portion b; each second connection terminal 202 may further include: a seventh portion g extending in the first direction X and located on a side of the sixth portion f away from the area where the first connection terminal 201 is located; in the floating terminal 103 and the second connection terminal 202 which are correspondingly arranged, an orthographic projection of the seventh portion g on the base substrate 100 overlaps an orthographic projection of a gap between the fourth portion d and the fifth portion e on the base substrate 100. In some embodiments, the orthographic projection of the seventh portion g on the base substrate 100 coincides with the orthographic projection of the gap between the fourth and fifth portions d, e on the base substrate 100. Alternatively, the orthographic projection of the seventh portion g on the base substrate 100 and the orthographic projection of the gap between the fourth and fifth portions d, e on the base substrate 100 have a relative offset therebetween within an error tolerance range.

The at least one floating terminal 103 and the at least one second connection terminal 202 are arranged in the above manner, so that on one hand, the bonding area between the flexible circuit board 02 and the substrate 01 can be increased, and thus, the generation of cracks is more effectively inhibited or the cracks can be prevented from expanding to the area where the bonding terminals 101 is located; on the other hand, the alignment can be realized between the flexible circuit board 02 and the substrate 01 in the first direction X and the second direction Y in the bonding procedure, to obtain a better alignment effect, and to achieve a better alignment accuracy.

Optionally, in the above module structure provided in the embodiment of the present disclosure, as shown in FIG. 10 to FIG. 13, the fourth portion d and the fifth portion e may penetrate through the second portion b, so that the area of the floating terminal 103 is greater, and thus the floating terminal can be identified more easily in the alignment process, which is beneficial to improving the alignment accuracy. In addition, the bonding area between the flexible circuit board 02 and the substrate 01 can be increased, and the problem of cracks can be effectively solved.

Figure 17:
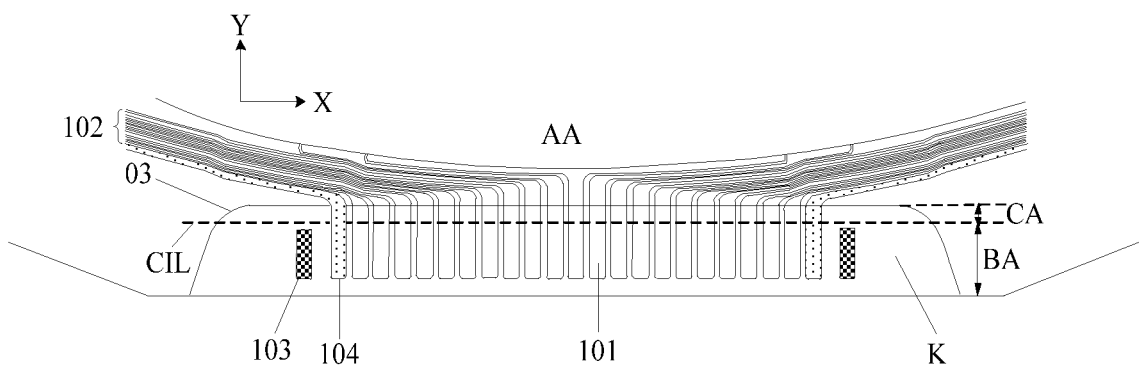
FIG. 17 is a schematic diagram of a structure of a substrate according to an embodiment of the present disclosure.
Figure 18:
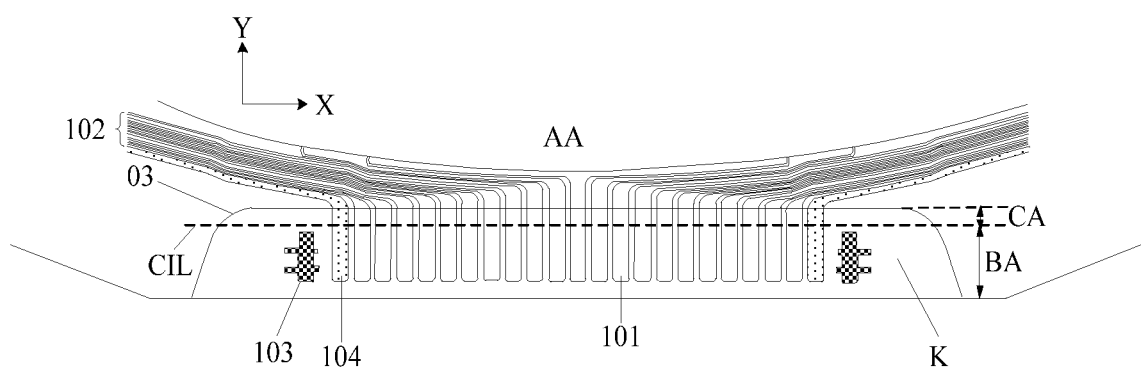
FIG. 18 is a schematic diagram of another structure of a substrate according to an embodiment of the present disclosure.

Optionally, in the above module structure provided in the embodiment of the present disclosure, as shown in FIGS. 8 and 13, the substrate 01 may further include at least one signal line 104 formed integrally with the at least one floating terminal 103, and disposed around the functional area AA. In a specific implementation, as shown in FIGS. 17 and 18, the floating terminal 103 and the signal line 104 may be provided independently of each other. In some embodiments, the signal line 104 may be a ground signal line or a touch signal line. In the case that the floating terminal 103 and the signal line 104 have a one-piece structure, a ground signal or a touch signal provided by the flexible circuit board 02 may be applied to the ground signal line or the touch signal line through the floating terminal 103. Alternatively, in some embodiments, the floating terminal 103 may not be loaded with any signal, and accordingly, the signal line 104 formed integrally with the floating terminal 103 is not loaded with any signal. When the floating terminal 103 and the signal line 104 are provided independently of each other, the flexible circuit board 02 may load signals to the floating terminal 103 and the signal line 104, respectively, or the flexible circuit board 02 may not load any signal to the floating terminal 103 and the signal line 104.

Optionally, in the above module structure provided in the embodiment of the present disclosure, as shown in FIG. 19 to FIG. 25, the base substrate 100 may further include the transition area CA located between the bonding area BA and the functional area AA; the at least one floating terminal 103 may extend in the second direction Y at least to cover the interface line CIL between the bonding area BA and the transition area, so that the area of the floating terminal 103 is greater, thereby better dissipating stress and preventing cracks from generating.

It should be noted that in the present disclosure, the functional area AA is an area where a functional device (e.g., a touch electrode, a light emitting device) and the like are disposed; the bonding area BA is an area where the substrate 01 is bonded to the flexible circuit board 02; and the transition area is an area where wires connecting the functional device and the flexible circuit board 02 are disposed.

Figure 19:
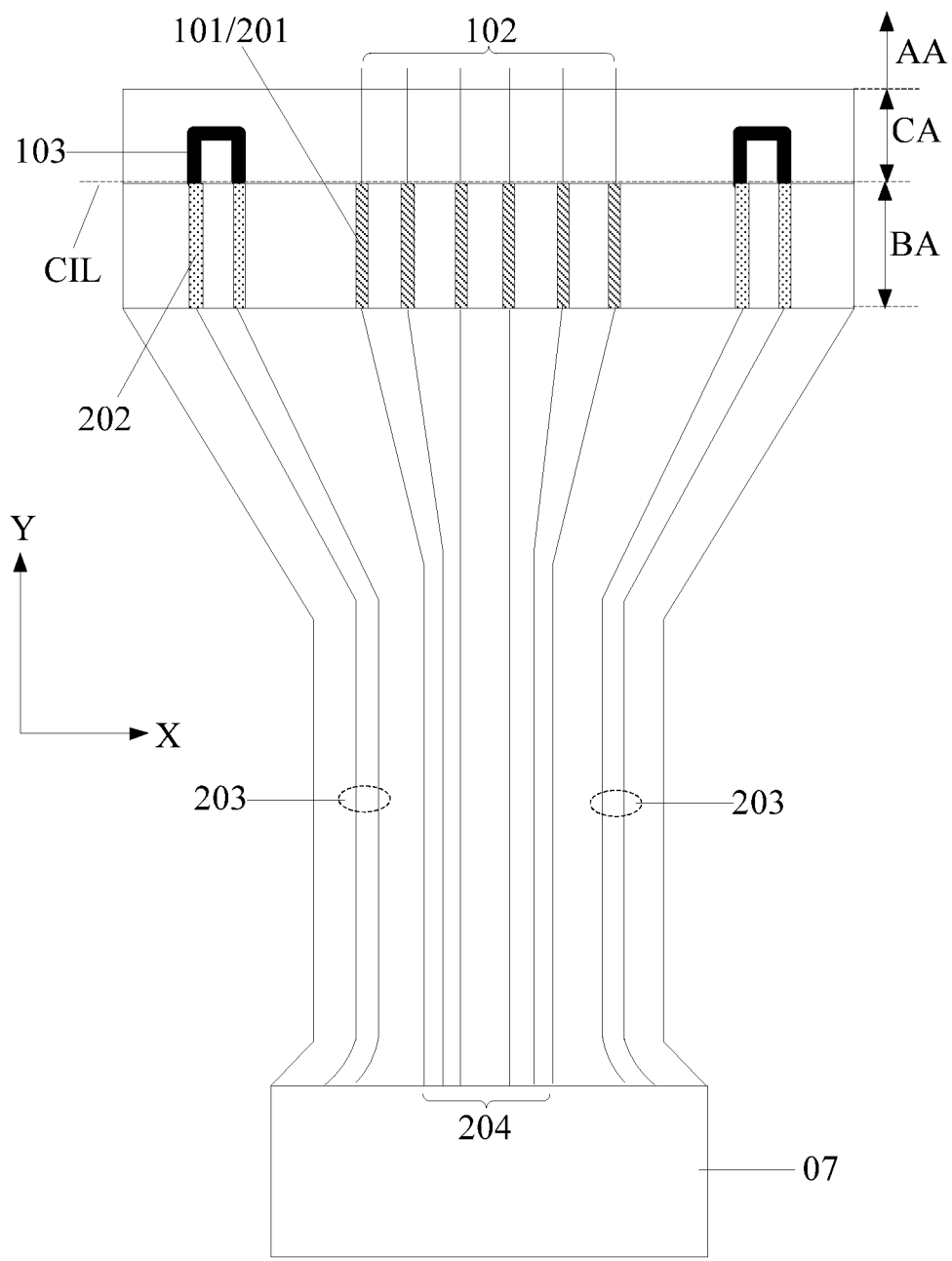
FIG. 19 is a schematic diagram of another structure of a display apparatus according to an embodiment of the present disclosure.
Figure 20:
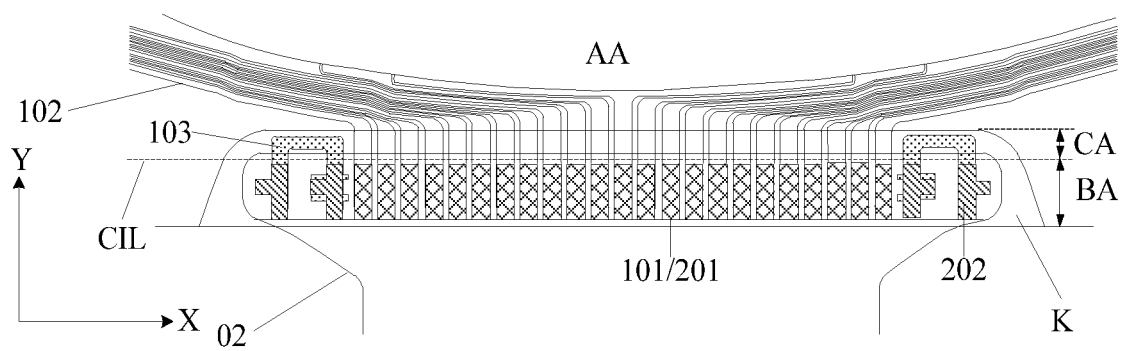
FIG. 20 is a schematic diagram of another structure of a display apparatus according to an embodiment of the present disclosure.
Figure 21:
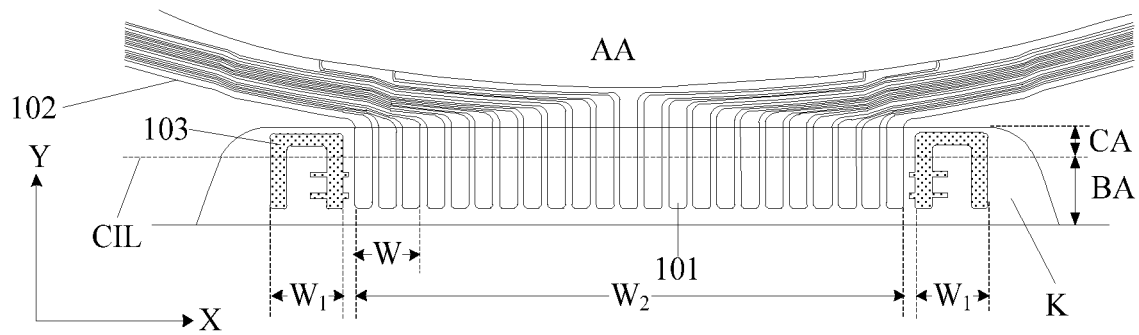
FIG. 21 is a schematic diagram of a structure of a touch substrate included in a display apparatus shown in FIG. 20.
Figure 22:
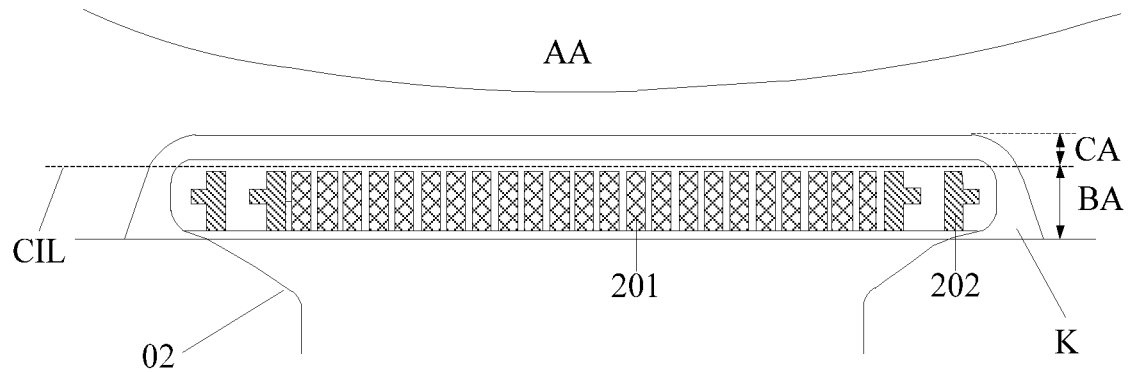
FIG. 22 is a schematic diagram of a structure of a touch flexible circuit board included in a display apparatus shown in FIG. 20.
Figure 23:
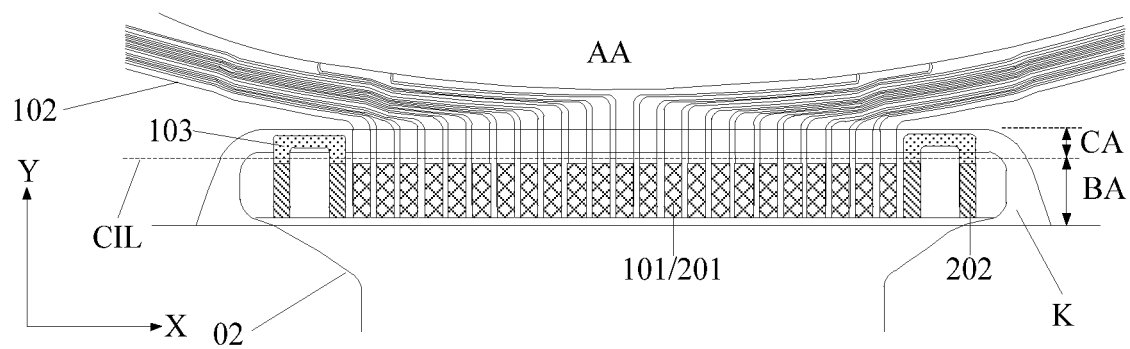
FIG. 23 is a schematic diagram of another structure of a display apparatus according to an embodiment of the present disclosure.
Figure 29:
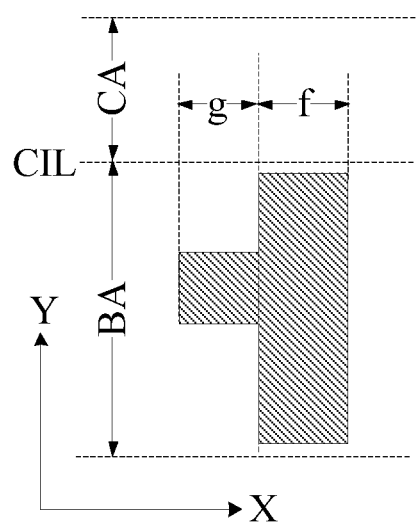
FIG. 29 is a schematic diagram of a structure of a second connection terminal shown in FIG. 22.

As shown in FIGS. 19 to 29, the floating terminal 103 and the at least one second connection terminal 202 provided corresponding thereto may have various shapes. For example, the floating terminal 103 may include: a first portion a and a second portion b arranged in a first direction X, and a third portion c connecting the first portion a and the second portion b; wherein the first portion a and the second portion b extend from the bonding area BA to the transition area CA, the second portion b is closer to the area where the bonding terminals 101 are located than the first portion a, and the third portion c is located in the transition area CA, as shown in FIGS. 21, 24, 26 and 27; the second connection terminal 202 may include a sixth portion f extending in the second direction Y, as shown in FIGS. 22, 25, 28 and 29; each of the at least one floating terminal 103 is disposed corresponding to the two second connection terminals 202. In an embodiment, each floating terminal 103 is disposed corresponding to the two second connection terminals 202, wherein the sixth portions f of the two second connection terminals 202 are disposed corresponding to the first portion a and the second portion b of the floating terminal 103, respectively, as shown in FIGS. 20 and 23. As further shown in FIGS. 21 and 27, each floating terminal 103 may further include: a fourth portion d and a fifth portion e arranged in the second direction Y; wherein the fourth and fifth portions d, e are located in the bonding area BA and in contact with the second portion b. In some embodiments, the fourth and fifth portions d, e are located in the bonding area BA and extend through the second portion b; as shown in FIGS. 22 and 29, the second connection terminal 202 may further include: a seventh portion g extending in the first direction X and located on a side of the sixth portion f away from the area where the first connection terminal 201 is located; in the at least one floating terminal 103 and the at least one second connection terminal 202 correspondingly arranged, an orthographic projection of the seventh portion g on the base substrate 100 overlaps an orthographic projection of a gap between the fourth portion d and the fifth portion e on the base substrate 100. In some embodiments, the orthographic projection of the seventh portion g on the base substrate 100 coincides with the orthographic projection of the gap between the fourth and fifth portions d, e on the base substrate 100. Alternatively, the orthographic projection of the seventh portion g on the base substrate 100 and the orthographic projection of the gap between the fourth and fifth portions d, e on the base substrate 100 have a relative offset therebetween within an error tolerance range.

Figure 30:
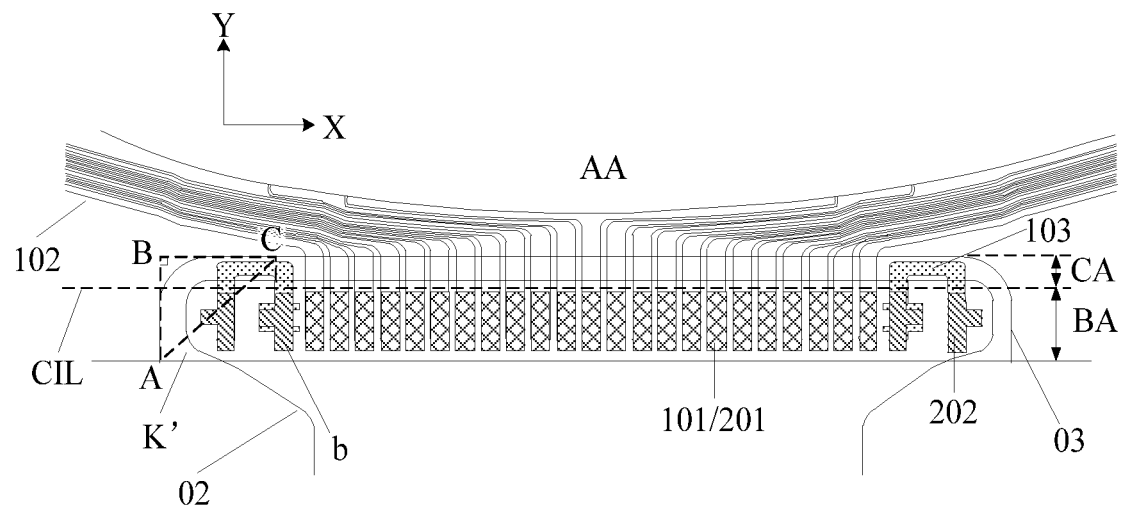
FIG. 30 is a schematic diagram of another structure of a display apparatus according to an embodiment of the present disclosure.
Figure 31:
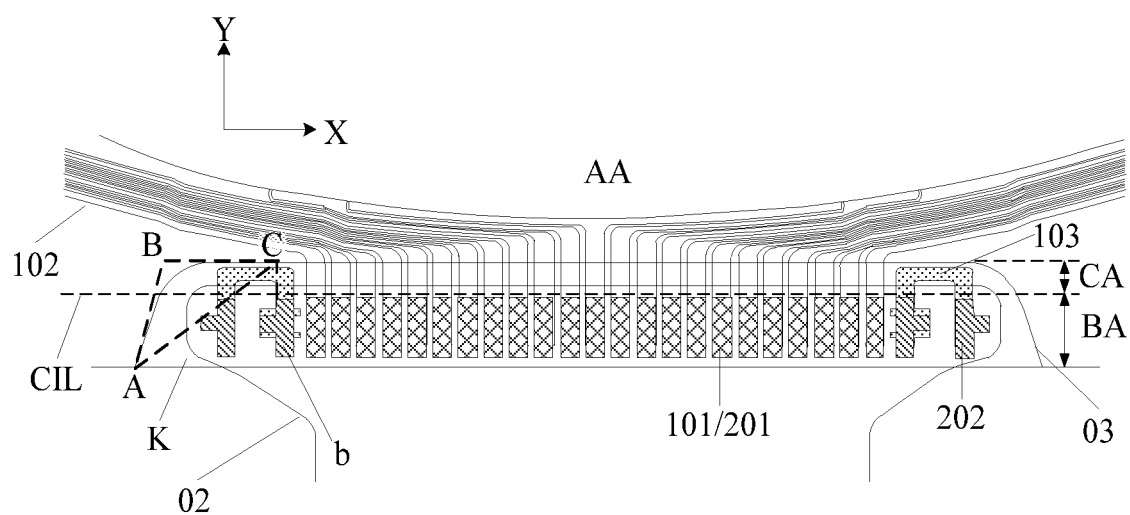
FIG. 31 is a schematic diagram of another structure of a display apparatus according to an embodiment of the present disclosure.

Optionally, in the above module structure provided in the embodiment of the present disclosure, when the at least one floating terminal 103 extends in the second direction Y at least to cover the interface line CIL between the bonding area BA and the transition area, optionally, as shown in FIG. 30 and FIG. 31, each floating terminal 103 extends in the second direction Y at least to cover the interface line CIL between the bonding area BA and the transition area. The module structure may further include a polarizer 03 located on a side where a functional surface of the substrate 01 (for example, a functional layer is provided on a side of the signal lines 102 away from the base substrate 100, and a surface of the functional layer away from the base substrate 100 is the functional surface) is located, where the polarizer 03 includes an opening K, and an orthographic projection of the opening K on the base substrate 100 overlaps an orthographic projection of the transition area CA and the bonding area BA on the base substrate 100; the second portion b has a first side away from the bonding terminals 101; and an orthographic projection of an extension line of the first side pointing towards the functional area AA on the base substrate 100 and an orthographic projection of a first edge, which extends along the first direction X and is adjacent to the functional area AA, of the opening K on the base substrate 100 intersect each other at a first intersection point C; the opening K has a second edge intersecting the first direction X at an endpoint A away from the functional area AA, and an orthographic projection of an extension line of the second edge (as a straight line) pointing towards the functional area AA on the base substrate 100 or an orthographic projection of a tangent line of the second edge (as an arc line) at the endpoint A on the base substrate 100 intersects with an orthographic projection of an extension line of the first edge on the base substrate 100 at a second intersection point B; the first intersection point C, the second intersection point B and the endpoint A of the opening are sequentially connected to form a triangle ABC, and an angle (namely, angle B) of the triangle ABC at the second intersection point B is a right angle or an obtuse angle.

In the related art, a corner of the opening K of the polarizer 03 has a shape similar to a letter "U" with 90°. The at least one floating terminal 103 extends in the second direction Y at least to cover the interface line CIL between the bonding area BA and the transition area CA in the present disclosure, so that the risk of generating of cracks can be greatly reduced. Therefore, the present disclosure may use the "U" shaped opening K' (as shown in FIG. 30) in the related art, or may use the above "V" shaped opening K provided in the present disclosure (as shown in FIG. 31), which is not limited herein.

Figure 24:
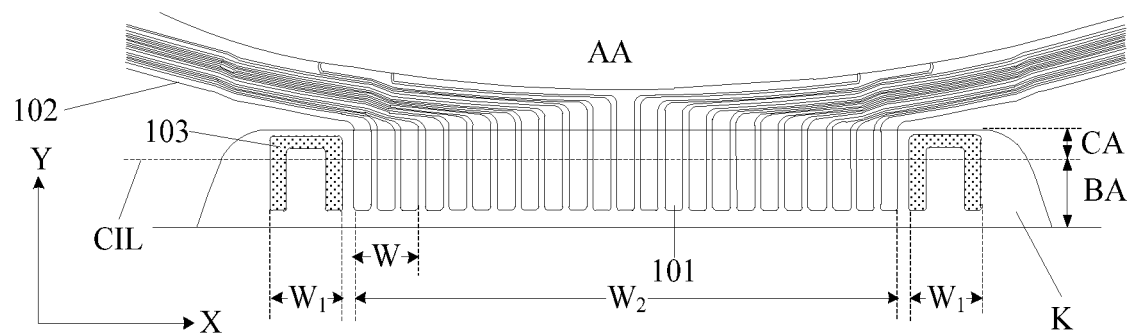
FIG. 24 is a schematic diagram of a structure of a touch substrate included in a display apparatus shown in FIG. 23.
Figure 25:
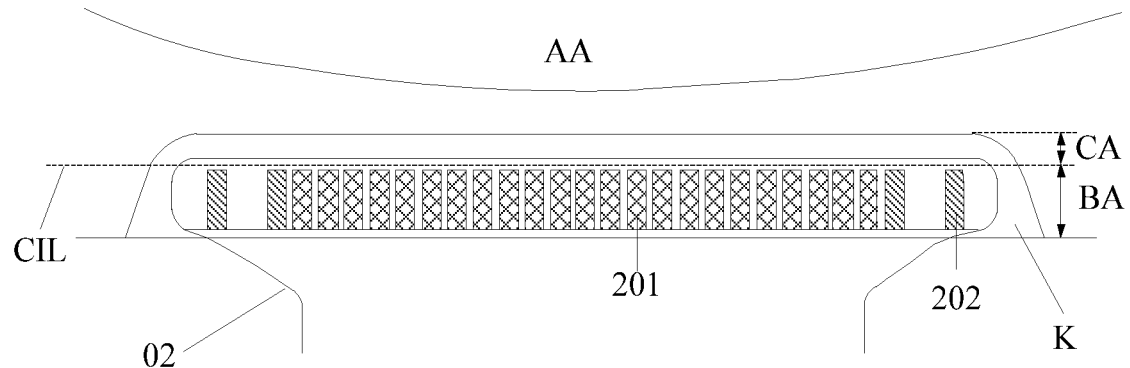
FIG. 25 is a schematic diagram of a structure of a touch flexible circuit board included in a display apparatus shown in FIG. 23.
Figure 26:
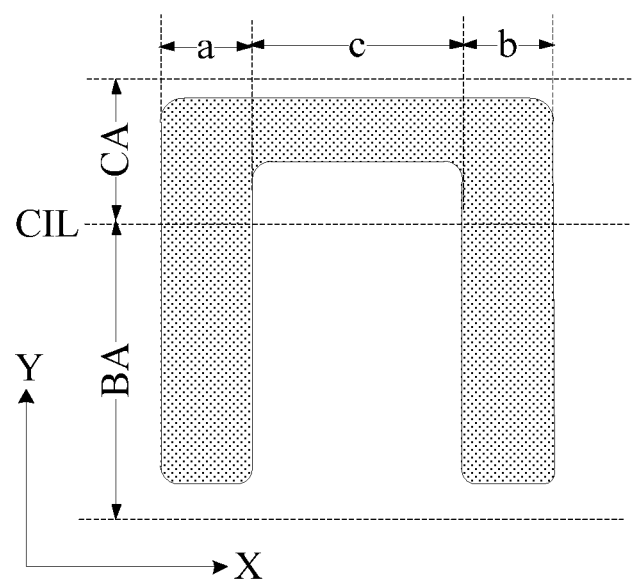
FIG. 26 is a schematic diagram of a structure of a floating terminal shown in FIG. 24.
Figure 27:
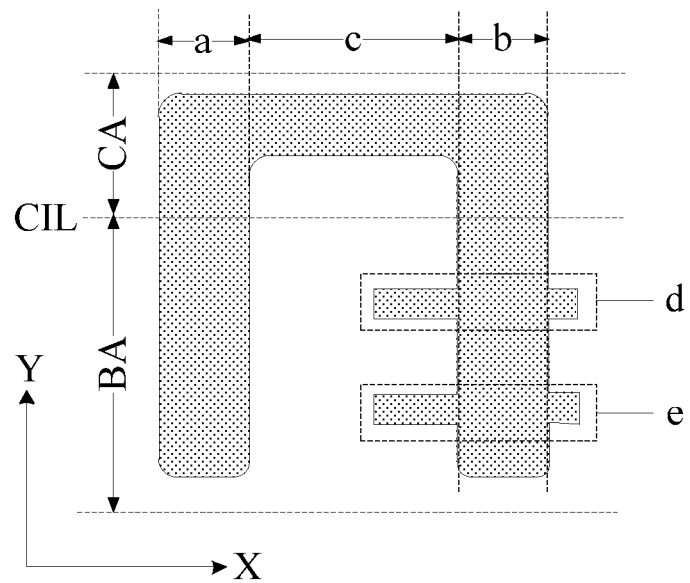
FIG. 27 is a schematic diagram of a structure of a floating terminal shown in FIG. 21.
Figure 28:
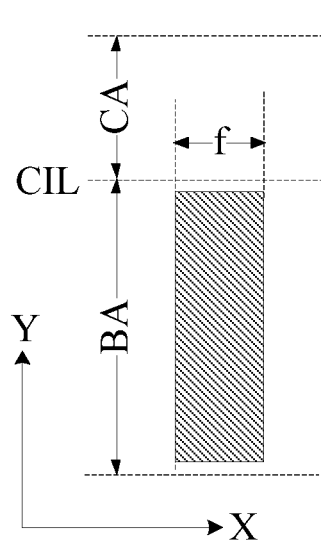
FIG. 28 is a schematic diagram of a structure of a second connection terminal shown in FIG. 25.

Optionally, in the above module structure provided by the embodiment of the present disclosure, in order to effectively prevent cracks from occurring on the bonding terminals 101, as shown in FIGS. 21 and 24, in the first direction X, a ratio of a sum of widths of all the floating terminals 103 (i.e., $N \times W_1$, where N is the total number of the floating terminals 103) located on one side of the plurality of bonding terminals 101 to a sum $W_2$ of widths of the plurality of bonding terminals 101 is in a range from 10% to 20%, i.e., $10\% \leq N \times W_1/W_2 \leq 20\%$. For example, $N \times W_1/W_2$ may be 10%, 11%, 12%, 13%, 14%, 15%, 16%, 17%, 18%, 19%, or 20%, etc. Optionally, a width W1 of each floating terminal 103 in the first direction X may be equal to a sum W of widths of at least three bonding terminals 101.

It is noted that in the present disclosure, the "sum of widths" is specifically a sum of widths of the plurality of terminals and widths of gaps between every two adjacent terminals.

Optionally, in the above module structure provided in the embodiment of the present disclosure, in order to simplify a manufacturing procedure and save a production cost, the plurality of bonding terminals 101 and the plurality of floating terminals 103 may be arranged in the same layer, and/or the plurality of first connection terminals 201 and the plurality of second connection terminals 202 may be arranged in the same layer.

It should be understood that "the same layer" in the present disclosure refers to a layer structure formed by the following steps: a film layer for forming a specific pattern is formed by using the same film forming process and then formed through a one-time patterning process by using the same mask plate. That is, the one-time patterning process corresponds to one mask (also called as a photo-mask). Depending on the specific pattern, the one-time patterning process may include multiple processes of exposure, development or etching, and the specific pattern in the formed layer structure may be continuous or discontinuous, and the specific pattern may be at different heights or have different thicknesses.

Optionally, in the above module structure provided in an embodiment of the present disclosure, as shown in FIG. 3, FIG. 7, FIG. 8, FIG. 10, FIG. 11, FIG. 13, FIG. 17 to FIG. 21, FIG. 23, FIG. 24, FIG. 30, and FIG. 31, the substrate 01 may further include: the plurality of signal lines 102 electrically connected to the plurality of bonding terminals 101, respectively. Optionally, each signal line 102 and the corresponding bonding terminal 101 electrically connected to each other have a one-piece structure.

In addition, the module structure provided in the embodiment of the present disclosure, as shown in FIG. 3, may further include: an anisotropic conductive adhesive (ACF) 04 located between a layer where the first connection terminal 201 is located and a layer where the bonding terminal 101 is located, and an orthographic projection of the anisotropic conductive adhesive 04 on the base substrate 100 at least completely covers the bonding terminals 101. It should be noted that the anisotropic conductive adhesive 04 may be disposed in the area where the bonding terminals 101 are located, and may also fill the gaps between every two adjacent bonding terminals.

The anisotropic conductive adhesive 04 is in a conductive state in a direction in which the bonding terminals 101 point towards the first connection terminals 201 and is in an insulating state in a direction perpendicular to the direction in which the bonding terminals 101 point towards the first connection terminal 201s, and only the first connection terminal 201 needs to apply a signal to the bonding terminal 101, and the second connection terminal 202 does not need to apply a signal to the floating terminal 103, so that the anisotropic conductive adhesive 04 is only provided between the bonding terminals 101 and the first connection terminals 201. In other words, it is necessary that the orthographic projection of the anisotropic conductive adhesive 04 on the base substrate 100 completely covers the bonding terminals 101.

Based on the same inventive concept, the embodiment of the present disclosure further provides a touch module, which includes the above module structure provided by the embodiment of the present disclosure. Since the principle of solving the problem by the touch module is similar to that of the module structure, how to implement the touch module may be referred to that for the module structure, and is not repeated herein.

In some embodiments, in the touch module provided in the embodiments of the present disclosure, a touch function may be implemented based on a mutual capacitance. Specifically, the signal lines 102 may include a touch driving signal line (Tx line) and a touch sensing signal line (Rx line), the flexible circuit board 02 may be a touch flexible circuit board for providing a touch driving signal and a touch sensing signal, and the functional area AA may be a touch area provided with a touch driving electrode (Tx) electrically connected to the touch driving signal line and a touch sensing electrode (Rx) electrically connected to the touch sensing signal line.

In some embodiments, in the touch module provided in the embodiment of the present disclosure, the touch function may be alternatively implemented based on a self-capacitance. Specifically, the signal lines 102 may include a touch signal line (Touch line), the flexible circuit board 02 may be a touch flexible circuit board for providing a touch signal, and the functional area AA is a touch area provided with a self-capacitance electrode electrically connected to the touch signal line.

It should be noted that other essential components of the touch module are understood by one of ordinary skill in the art to be provided, and are not described herein, and should not be construed as limitations of the present disclosure.

Based on the same inventive concept, the embodiment of the present disclosure further provides a display module, which includes the module structure provided by the embodiment of the present disclosure. Because the principle of solving the problems by the display module is similar to that for the module structure, how to implement the display module may be referred to the embodiment of the module structure, and is not repeated herein.

In some embodiments, in the display module provided in the embodiment of the present disclosure, the signal lines 102 may include a data signal line (Data line) and a scan signal line (Gate line), the flexible circuit board 02 may be a flexible display circuit board for providing a data signal and a scan signal, the functional area AA is a display area in which organic light emitting diodes (OLEDs), quantum dot light emitting diodes (QLEDs), micro light emitting diodes (Micro LEDs), or the like may be disposed, and further, pixel driving circuits electrically connected to the light emitting diodes, the data signal line, and the scan signal line may be disposed.

It should be noted that other essential components of the display module are understood by one of ordinary skill in the art to be provided, and are not described herein, and should not be construed as limitations of the present disclosure.

Based on the same inventive concept, an embodiment of the present disclosure further provides a display apparatus, as shown in FIG. 3, including the touch module provided in the embodiment of the present disclosure and the display module 05 provided in the embodiment of the present disclosure, so that the display apparatus has both a touch function and a display function. Specifically, the touch module including the above module structure provided in the embodiments of the present disclosure is taken as an example in the present disclosure for explanation. Therefore, FIG. 3 shows the substrate 01, the flexible circuit board 02 and the polarizer 03 included in the touch module, and the components included in the display module 05 are not shown in detail. It should be understood that in the same display apparatus, in the case that the touch module includes the polarizer 03, the display module 03 may share the polarizer 03 with the touch module 03, that is, the display module 03 may not be provided with the polarizer 03. With reference to FIG. 3, in the display apparatus, the substrate 01 included in the touch module may be located on a side of a display surface (i.e., a light outgoing surface) of the display module 05, and the flexible circuit board 02 included in the touch module may be bent from a functional surface of the substrate 01 towards a direction away from the display surface of the display module 05.

Optionally, the display apparatus may be any product or component with a display function, such as a smart watch, a mobile phone, a tablet computer, a television, a display, a notebook computer, a digital photo frame, a navigator, a fitness wristband, a personal digital assistant or the like. Other essential components of the display apparatus are understood by one of ordinary skill in the art to be provided, and are not described herein, and should not be construed as limitations of the present disclosure. In addition, because the principle of solving the problems by the display apparatus is similar to that of solving the problems by the module structure, how to implement the display apparatus may refer to the embodiment of the module structure, and is not repeated herein.

Figure 32:
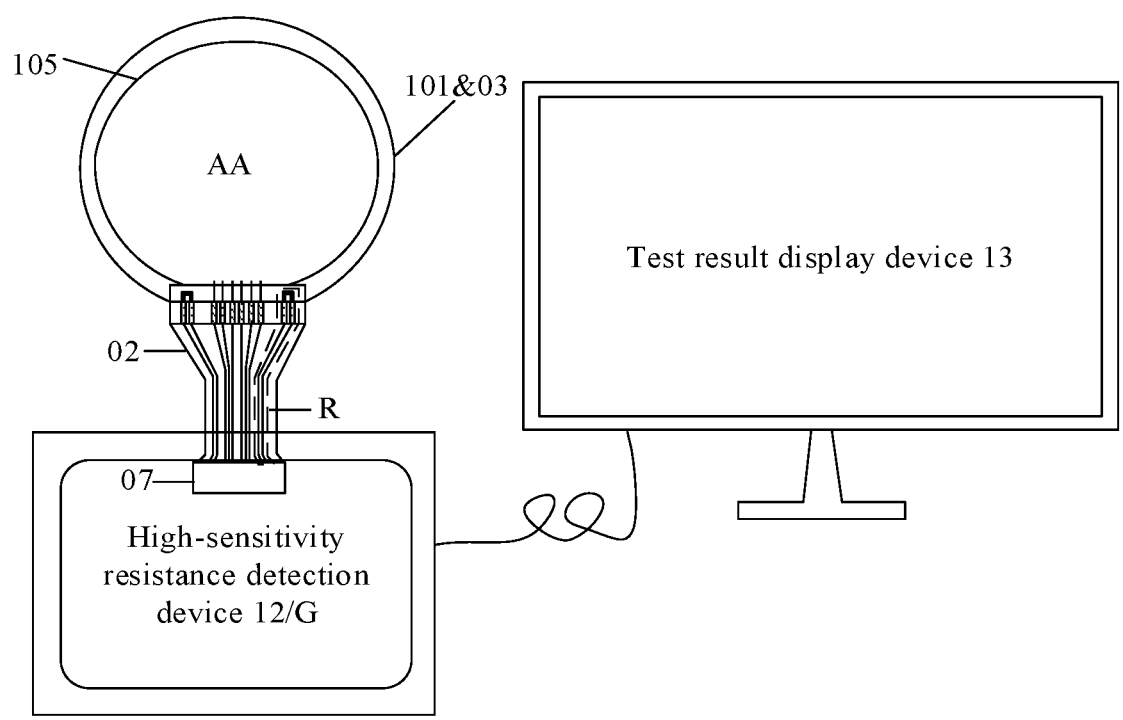
FIG. 32 is a schematic diagram showing a crack detection principle according to an embodiment of the present disclosure.

Optionally, the display apparatus provided in the embodiment of the present disclosure, as shown in FIG. 3 and FIG. 32, may further include: a main flexible circuit board 06 between the display module 05 and the flexible circuit board 02 included in the touch module, and an adapter 07 for connecting the main flexible circuit board 06 to the flexible circuit board 02 included in the touch module; the flexible circuit board 02 of the touch module may further include: a plurality of detection signal lines 203 configured to electrically connect the plurality of second connection terminals 202 of the touch module to the adapter 07 respectively, and configured to detect cracks when a loop is formed between the second connection terminal 202 and the floating terminal 103 of the touch module.

Figure 33:
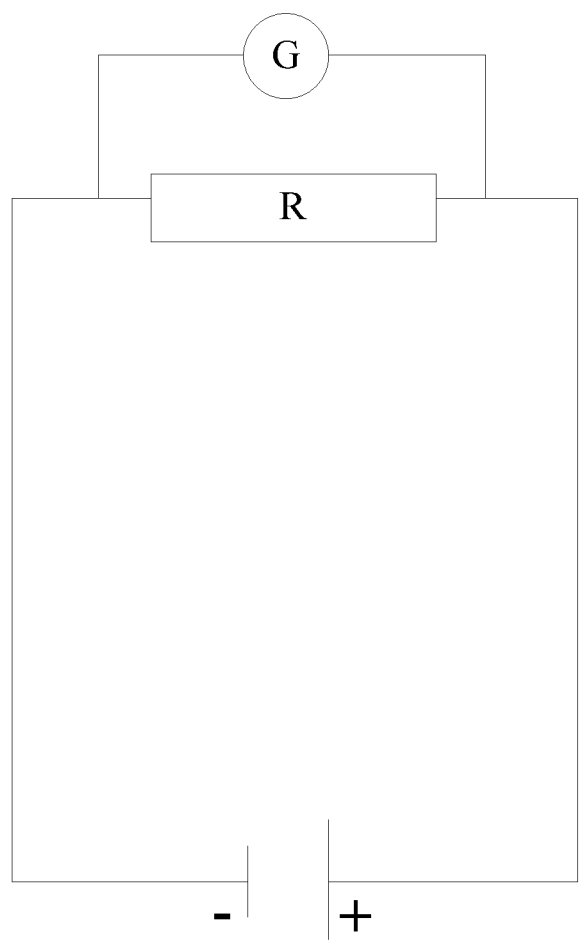
FIG. 33 is an equivalent circuit diagram of FIG. 32.

The principle of detecting cracks by the detection signal lines 203 is realized based on a change of an equivalent resistance of a detection loop, as shown in FIG. 33. Specifically, the detection loop formed by the second connection terminal 202 and the floating terminal 103 disposed corresponding to each other and the detection signal line 203 connected between the second connection terminal 202 and the floating terminal 103 is equivalent to a resistor R in FIG. 33. If a crack occurs at an edge of the flexible circuit board 02 along the interface line CIL between the bonding area BA and the transition area CA, the detection loop formed by the second connection terminal 202 and the floating terminal 103 disposed corresponding to each other and the detection signal line 203 connected therebetween at this edge is inevitably disconnected, so that a resistance of the detection loop is increased, and thus it is determined that a defect, i.e., the crack, occurs at the edge. Regardless of the crack being severe or slight, the resistance of the detection loop changes. Obviously, for a relatively light crack, an increment in the equivalent resistance in the detection loop is relatively small; and for a severe crack (such as a complete crack), the increment in the equivalent resistance in the detection loop is necessarily relatively great. Therefore, in a specific implementation, a high-sensitivity resistance detection device 12 (which is equivalent to a resistance tester G in FIG. 33) is embedded to detect the cracks with high precision, and the detection result is displayed by a test result display device 13. In other words, the high-sensitivity resistance detection device 12 can accurately monitor the produced defective samples in real time during the bending process, and even a slight crack can be effectively identified and intercepted. Therefore, in the present disclosure, the yield can be greatly improved in the bending process, waste of all levels of production raw materials is greatly saved, and the production cost of the display apparatus is remarkably reduced. In addition, as described above, the detection scheme can be combined with the performance of the final display apparatus to derive the optimal parameters for the bending process from a reverse direction, thereby improving the product yield of the panel manufacturer and guiding the panel manufacturer to optimize the parameters for the bending process.

It should be understood that in order to form the loop between the second connection terminal 202 and the floating terminal 103, it is necessary to provide the anisotropic conductive adhesive 04 between the second connection terminal 202 and the floating terminal 103.

Generally, the display apparatus provided in the embodiment of the present disclosure, as shown in FIG. 3, may further include: a first adhesive layer 08 located between the display module 05 and the substrate 01 included in the touch module, a second adhesive layer 09 and a protective cover plate 10 sequentially located on a side of the polarizer 03 away from the display module 05. Optionally, a filling layer (Space Film (SF)) 11 may be further disposed to supplement an offset between the polarizer 03 and the flexible circuit board 02 included in the touch module. In addition, as shown in FIG. 19, the flexible circuit board 02 may further include: a plurality of connecting lines 204, wherein one end of each connecting line 204 is electrically connected to one first connection terminal 201, and the other end of the connecting line 204 is electrically connected to the adapter 07.

The module structure, the touch module, the display module and the display apparatus are provided by the embodiment of the present disclosure, the module structure includes: a substrate including a base substrate, wherein the base substrate includes a functional area, a bonding area positioned on one side of the functional area; a plurality of bonding terminals are provided in the bonding area and arranged along a first direction and each bonding terminal extends along a second direction, and at least one floating terminal is provided in the bonding area and on at least one side of the plurality of bonding terminals in the first direction; the module structure further includes a flexible circuit board, including: a plurality of first connection terminals provided corresponding to the plurality of bonding terminals, and at least one second connection terminal provided corresponding to the at least one floating terminal. The at least one floating terminal is provided on the at least one side of the bonding terminals in the bonding area, and the at least one second connection terminal are provided corresponding to the at least one floating terminal, so that the effective bonding area between the substrate and the flexible circuit board is increased, and thus, the cracks can be prevented by the at least one floating terminal from expanding to the area where the bonding terminals are located, thereby significantly eliminating the pulling stress for the signal lines connected to the bonding terminals at the interface line, and playing a positive role in preventing a crack from occurring in a product. Moreover, the opening of the polarizer, which has an overlapping area with the bonding area BA, is changed into a novel "V" shape from a conventional "U" shape, and an angle of the opening is an obtuse angle, so that the stress on the bonding area is reduced, and thus, the risk that the crack is generated in the signal line in the bonding area is further reduced, which ensures that functions of the product are normally realized and the process yield is improved.

It will be apparent to one of ordinary skill in the art that various changes and modifications may be made to the embodiments of the present disclosure without departing from the spirit and scope of the embodiments of the present disclosure. Thus, if such changes and modifications of the embodiments of the present disclosure are within the scope of the claims of the present disclosure and their equivalents, the present disclosure is also intended to encompass such changes and modifications.

What is claimed is:
1. A module structure, comprising:
a substrate comprising a base substrate, wherein the base substrate comprises a functional area and a bonding area on one side of the functional area; a plurality of bonding terminals are provided in the bonding area and arranged along a first direction and each bonding terminal extends along a second direction, and at least one floating terminal is provided in the bonding area and on at least one side of the plurality of bonding terminals in the first direction; and a flexible circuit board, comprising: a plurality of first connection terminals corresponding to the plurality of bonding terminals, and at least one second connection terminal corresponding to the at least one floating terminal, wherein each of the at least one floating terminal comprises a second portion extending in the second direction;

each of the at least one second connection terminal comprises a sixth portion extending in the second direction; and wherein an orthographic projection of the sixth portion of a second connection terminal on the base substrate overlaps with an orthographic projection of the second portion of a corresponding floating terminal on the base substrate.

2. The module structure of claim 1, wherein the at least one floating terminal comprises a plurality of floating terminals provided on both sides of the plurality of bonding terminals in the first direction; and at least one of the plurality of floating terminal is provided on each side of the plurality of bonding terminals in the first direction.

3. The module structure of claim 2, wherein the number of floating terminals on one side of the plurality of bonding terminals in the first direction is the same as that of floating terminals on the other side of the plurality of bonding terminals in the first direction.

4. The module structure of claim 1, wherein at least a part of the second portion and at least a part of the sixth portion are in the bonding area;

the module structure further comprises a polarizer on a side where a functional surface of the substrate is located, wherein the polarizer comprises an opening, and an orthographic projection of the opening on the base substrate overlaps an orthographic projection of the bonding area on the base substrate;

the second portion has a first side away from the bonding terminals; and an orthographic projection of an extension line of the first side pointing towards the functional area on the base substrate and an orthographic projection of a first edge, which extends along the first direction and is adjacent to the functional area, of the opening on the base substrate intersect each other at a first intersection point;

the opening has a second edge intersecting the first direction at an endpoint away from the functional area, and an orthographic projection of an extension line of the second edge pointing towards the functional area on the base substrate or an orthographic projection of a tangent line of the second edge at the endpoint on the base substrate intersects with an orthographic projection of an extension line of the first edge on the base substrate at a second intersection point; and the first intersection point, the second intersection point and the endpoint of the opening are sequentially connected to form a triangle, and an angle of the triangle at the second intersection point is an obtuse angle.

5. The module structure of claim 4, wherein the angle is in a range from 105° to 115°.

6. The module structure of claim 5, wherein a distance from the second intersection point to the first intersection point is substantially equal to a distance from the second intersection point to the endpoint.

7. The module structure of claim 1, wherein the floating terminal further comprises: a fourth portion and a fifth portion arranged in the second direction and in the bonding area and in contact with the second portion;

the second connection terminal further comprises: a seventh portion extending in the first direction and on a side of the sixth portion away from an area where the plurality of first connection terminals are located; and wherein in the floating terminal and the second connection terminal corresponding to each other, an orthographic projection of the seventh portion on the base substrate overlaps an orthographic projection of a gap between the fourth portion and the fifth portion on the base substrate.

8. The module structure of claim 7, wherein the fourth portion and the fifth portion extend through the second portion.

9. The module structure of claim 8, wherein the substrate further comprises at least one signal line formed integrally with the at least one floating terminal and around the functional area.

10. The module structure of claim 7, wherein the base substrate further comprises a transition area between the bonding area and the functional area; and the at least one floating terminal extends in the second direction at least to cover an interface line between the bonding area and the transition area.

11. The module structure of claim 10, wherein the floating terminal further comprises a first portion alongside the second portion, and a third portion connecting the first portion and the second portion;

wherein the first portion and the second portion extend from the bonding area to the transition area;

the second portion is closer to an area where the plurality of bonding terminals are located than the first portion; and the third portion is in the transition area;

each of the at least one floating terminal is arranged corresponding to the two second connection terminals; and wherein the sixth portions of the two second connection terminals are arranged corresponding to the first portion and the second portion of the floating terminal, respectively.

12. The module structure of claim 11, further comprising a polarizer on a side where a functional surface of the substrate is located, where the polarizer comprises an opening, and an orthographic projection of the opening on the base substrate overlaps an orthographic projection of the transition area and the bonding area on the base substrate;

the second portion has a first side away from the bonding terminals; and an orthographic projection of an extension line of the first side pointing towards the functional area on the base substrate and an orthographic projection of a first edge, which extends along the first direction and is adjacent to the functional area, of the opening on the base substrate intersect each other at a first intersection point;

the opening has a second edge intersecting the first direction and the second direction at an endpoint away from the functional area, and an orthographic projection of an extension line of the second edge pointing towards the functional area on the base substrate or an orthographic projection of a tangent line of the second edge at the endpoint on the base substrate intersects with an orthographic projection of an extension line of the first edge on the base substrate at a second intersection point; and the first intersection point, the second intersection point and the endpoint of the opening are sequentially connected to form a triangle, and an angle of the triangle at the second intersection point is a right angle or an obtuse angle.

13. The module structure of claim 12, wherein a ratio of a sum of widths of all of floating terminals on one side of the plurality of bonding terminals to a sum of widths of the plurality of bonding terminals in the first direction is in a range from 10% to 20%.

14. The module structure of claim 13, wherein a width of each of the at least one floating terminal in the first direction is equal to a sum of widths of at least three of the plurality of bonding terminals.

15. The module structure of claim 14, wherein the plurality of bonding terminals are in a same layer as the at least one floating terminal.

16. The module structure of claim 15, wherein the plurality of first connection terminals are in a same layer as the plurality of second connection terminals.

17. The module structure of claim 16, wherein the substrate further comprises: a plurality of signal lines electrically connected to the plurality of bonding terminals, respectively.

18. The module structure of claim 17, wherein each of the plurality of signal lines and a corresponding bonding terminal of the plurality of bonding terminals have a one-piece structure.

19. A display module, comprising the module structure of claim 1.

* * * * *